(12) United States Patent
Schoeppach et al.

(10) Patent No.: US 7,729,065 B2
(45) Date of Patent: Jun. 1, 2010

(54) OPTICAL ELEMENT UNIT

(75) Inventors: Armin Schoeppach, Wohnsitz (DE); Johannes Rau, Wohnsitz (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/046,605

(22) Filed: Mar. 12, 2008

(65) Prior Publication Data

US 2008/0218721 A1 Sep. 11, 2008

Related U.S. Application Data

(63) Continuation of application No. PCT/EP2006/065891, filed on Aug. 31, 2006.

(60) Provisional application No. 60/716,619, filed on Sep. 13, 2005.

(51) Int. Cl.
*G02B 7/02* (2006.01)

(52) U.S. Cl. .................. 359/819; 359/811; 359/820; 359/822; 355/67; 348/340

(58) Field of Classification Search ............ 359/811, 359/818, 819, 820, 822, 823, 290–295, 223, 359/224; 355/30, 53, 67, 72–75; 356/614; 438/795; 372/34, 55, 65, 69, 100, 108; 385/14, 385/15, 88, 92, 93; 398/50; 73/655, 657; 348/340; 310/306, 309
See application file for complete search history.

(56) References Cited

U.S. PATENT DOCUMENTS

| 4,953,176 | A | * | 8/1990 | Ekstrand ............... 372/107 |
| 5,204,712 | A | * | 4/1993 | Bouwer et al. ........... 355/53 |
| 5,537,502 | A | * | 7/1996 | Patel et al. ............. 385/92 |
| 5,627,673 | A | * | 5/1997 | Min ...................... 359/290 |
| 5,771,097 | A | * | 6/1998 | Kusunose et al. ........ 356/520 |
| 6,229,657 | B1 | | 5/2001 | Holderer et al. ......... 359/822 |
| 6,867,848 | B2 | | 3/2005 | Ebinuma et al. ......... 355/75 |
| 6,870,632 | B2 | * | 3/2005 | Petasch et al. .......... 356/614 |
| 7,019,434 | B2 | * | 3/2006 | Helmbrecht ............. 310/309 |
| 7,138,745 | B1 | * | 11/2006 | Helmbrecht ............. 310/309 |
| 7,139,137 | B2 | * | 11/2006 | Sudoh ................... 359/811 |
| 7,193,794 | B2 | * | 3/2007 | Beck et al. .............. 359/822 |
| 7,280,145 | B2 | * | 10/2007 | Takizawa et al. ........ 348/340 |
| 7,294,282 | B1 | * | 11/2007 | Helmbrecht ............. 216/24 |
| 7,339,623 | B2 | * | 3/2008 | Kawai ................... 348/340 |
| 7,433,019 | B2 | * | 10/2008 | Kiuchi et al. ........... 355/67 |
| 2001/0039126 | A1 | | 11/2001 | Ebinuma | |
| 2002/0176094 | A1 | | 11/2002 | Petasch et al. | |

FOREIGN PATENT DOCUMENTS

EP 1 310 829 5/2003

* cited by examiner

*Primary Examiner*—Loha Ben
(74) *Attorney, Agent, or Firm*—Fish & Richardson P.C.

(57) ABSTRACT

An optical element unit including an optical element and an optical element holder is disclosed. The optical element holder includes a holding element and coupling elements. The holding element holds the optical element and is made of a ceramic material. The elastic coupling elements are attached to the holding element and contact the optical element. The elastic coupling elements provide deformation decoupling between the holding element and the optical element.

72 Claims, 10 Drawing Sheets

OPTICAL ELEMENT UNIT

CROSS-REFERENCE TO RELATED APPLICATIONS

This application is a continuation of international application serial number PCT/EP2006/065891, filed Aug. 31, 2006, which claims benefit under 35 U.S.C. 119(e)(1) of provisional U.S. patent application Ser. No. 60/716,619 filed Sep. 13, 2005, the entire contents of both of which are hereby incorporated herein by reference.

FIELD

The disclosure relates to optical element units used in exposure processes, in particular to optical element units of microlithography systems. The disclosure further relates to an optical element holder used to hold an optical element used for such optical element units. The disclosure also relates to optical exposure apparatuses including such an optical element unit. Furthermore, the disclosure relates to a method of manufacturing such an optical element holder. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical elements, such as lenses and mirrors etc., in the light path of the optical system. Those optical elements usually cooperate in an exposure process to transfer an image formed on a mask, reticle or the like onto a substrate such as a wafer. The optical elements are usually combined in one or more functionally distinct optical element groups. These distinct optical element groups may be held by distinct optical exposure units. Such optical exposure units are often built from a stack of optical element modules holding one or more optical elements. These optical element modules usually include an external generally ring shaped support device supporting one or more optical element holders each, in turn, holding an optical element. Generally, such optical element holders are made of metal, such as steel or the like.

Optical element groups including at least mainly refractive optical elements, such as lenses, mostly have a straight common axis of symmetry of the optical elements usually referred to as the optical axis. Moreover, the optical exposure units holding such optical element groups often have an elongated substantially tubular design due to which they are typically referred to as lens barrels.

SUMMARY

In some embodiments, the disclosure can, at least to some extent, provide good and long term reliable imaging properties of an optical system used in an exposure process.

In certain embodiments, the disclosure can increase imaging accuracy of an optical system used in an exposure process by raising the resonant frequencies of the support system supporting the optical system.

In some embodiments, the disclosure can increase imaging accuracy of an optical system used in an exposure process by increasing the rigidity and reducing the mass of the support system supporting the optical system.

In certain aspects, the disclosure is based on the teaching that good and long term reliable imaging properties may be achieved when at least parts of the optical element holder holding the respective optical element are made of a material having improved properties in terms of rigidity and mass with respect to the metals usually used for such parts of the optical element holder.

Although such materials of higher rigidity at lower mass usually have a reduced ductility and, thus, a reduced damage tolerance compared to the metals generally used, it has been found that, this is problem may be dealt with. This may be done, for example, by a corresponding support mechanism supporting these parts. Furthermore, it has to be noted that the optical elements themselves, due to their poor ductility, already impose such limitations that have to be dealt with anyway.

Furthermore, it has been found that considerable advantages, in particular in terms of long term accuracy, may be achieved if coupling elements are formed monolithically with at least one of the components they are coupling.

Thus, according to a first aspect of the disclosure there is provided an optical element unit including an optical element and an optical element holder. The optical element holder includes a holding element and a plurality of first coupling elements, the holding element is holding the optical element and is made of a ceramic material. The first coupling elements are attached to the holding element and contacting the optical element. The first coupling elements provide deformation decoupling between the holding element and the optical element.

According to a second aspect of the disclosure there is provided an optical element unit including an optical element and an optical element holder. The optical element holder includes a holding element and a plurality of first coupling elements. The holding element is holding the optical element. The holding element is made of a material having a ratio of its Young's modulus to its density of at least $$35 \frac{\text{GPa}}{\text{t/m}^3}.$$

The first coupling elements are attached to the holding element and contact the optical element. The first coupling elements provide deformation decoupling between the holding element and the optical element.

According to a third aspect of the disclosure there is provided an optical element unit including an optical element and an optical element holder holding the optical element. The optical element holder includes a holding element and at least one elastic first coupling element attached to the holding element. The at least one first coupling element is contacting the optical element. At least one of the first coupling element and the holding element is made of a ceramic material.

According to a fourth aspect of the disclosure there is provided an optical element holder for holding an optical element. The optical element holder includes a holding element and at least one elastic first coupling element attached to the holding element. The at least one first coupling element is arranged for contacting the optical element. At least one of the first coupling element and the holding element is made of a ceramic material.

According to a fifth aspect of the disclosure there is provided an optical element module for an optical exposure apparatus including an optical element unit according to the disclosure and a support device, the support device supporting the optical element unit via at least one second coupling device.

According to a sixth aspect of the disclosure there is provided an optical element unit including a plurality of optical element unit components. The plurality of optical element unit components includes an optical element, a holding element, a plurality of elastic coupling elements and a support device. The holding element holds the optical element while the support device supports the holding element. The coupling elements are coupled to the holding element and another one of the optical element unit components. At least one of the coupling elements is formed monolithically with at least one of the optical element unit components.

According to a seventh aspect of the disclosure there is provided a method of manufacturing an optical element holder for holding an optical element, including providing a holding element and at least one elastic coupling element attached to the holding element and arranged for contacting one of the optical element and a support device. The step of providing the holding element and the first coupling element includes a first step of monolithically manufacturing the coupling element and the holding element.

According to an eighth aspect of the disclosure there is provided a method of manufacturing an optical element holder for holding an optical element, including providing a holding element and a plurality of elastic coupling elements attached to the holding element and arranged for contacting one of the optical element and a support device. The step of providing the holding element and the coupling elements includes a first step of manufacturing at least one of the first coupling element and the holding elements from a ceramic material.

According to a ninth aspect of the disclosure there is provided an optical exposure apparatus for transferring an image of a pattern formed on a mask onto a substrate, including an optical projection system with an optical element unit according to the disclosure.

According to a ninth aspect of the disclosure there is provided a method of manufacturing a semiconductor device including performing an exposure step using an optical exposure apparatus according to the disclosure.

Further aspects and embodiments of the disclosure will become apparent from the dependent claims and the following description of embodiments which refers to the appended figures. All combinations of the features disclosed, whether explicitly recited in the claims or not, are within the scope of the disclosure.

DETAILED DESCRIPTION

Figure 1:
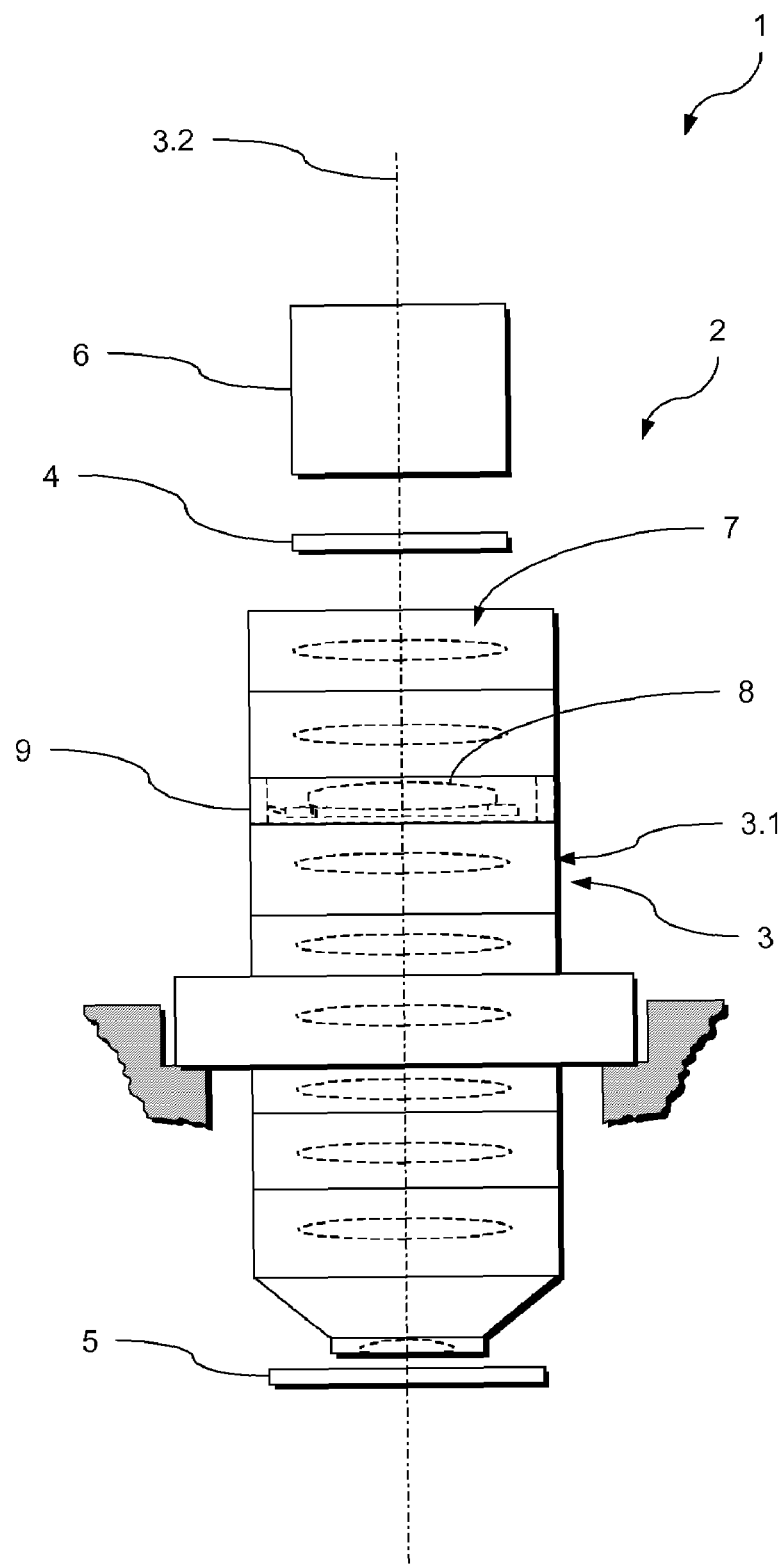
FIG. 1 is a schematic representation of an optical exposure apparatus according to the disclosure including an optical element module with an optical element unit according to the disclosure.

In the following, an embodiment of an optical exposure apparatus 1 according to the disclosure including an optical projection system 2 with an optical exposure unit 3 according to the disclosure will be described with reference to FIGS. 1 to 5.

The optical exposure apparatus 1 is adapted to transfer an image of a pattern formed on a mask 4 onto a substrate 5. To this end, the optical exposure apparatus 1 includes an illumination system 6 illuminating the mask 4 and the optical exposure unit 3. The optical exposure unit 3 projects the image of the pattern formed on the mask 4 onto the substrate 5, e.g. a wafer or the like.

To this end, the optical element unit 3 holds an optical element group 7. This optical element group 7 is held within a housing 3.1 of the optical exposure unit 3. The optical element group 7 includes a number of optical elements 8, such as lenses, mirrors or the like. These optical elements 8 are aligned along an optical axis 3.2 of the optical exposure unit 3.

The optical projection system 2 receives the part of the light path between the mask 4 and the substrate 5. Its optical elements 8 cooperate to transfer the image of the pattern formed on the mask 4 onto the substrate 5 located at the end of the light path. To increase the numerical aperture NA of the optical projection system 2, the optical projection system 2 may include an immersion zone located between the lower end of the optical exposure unit 3 and the substrate 5 and filled with an immersion medium such as highly purified water.

The optical exposure unit 3 is composed of a plurality of optical element modules 9 stacked and tightly connected to form the optical exposure unit 3. Each optical element module 9 holds one or more of the optical elements 8.

Figure 2:
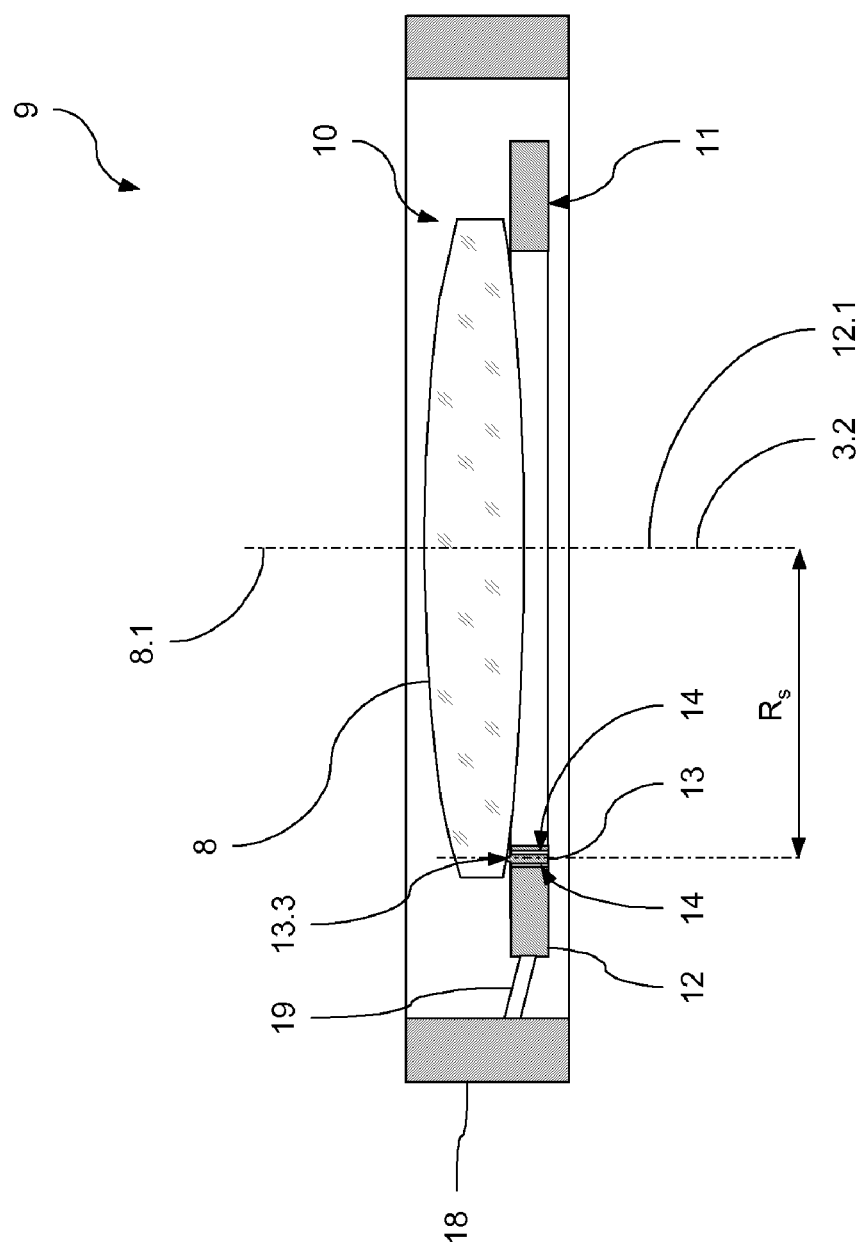
FIG. 2 is a schematic sectional representation of the optical element module with an optical element unit of FIG. 1.
Figure 3:
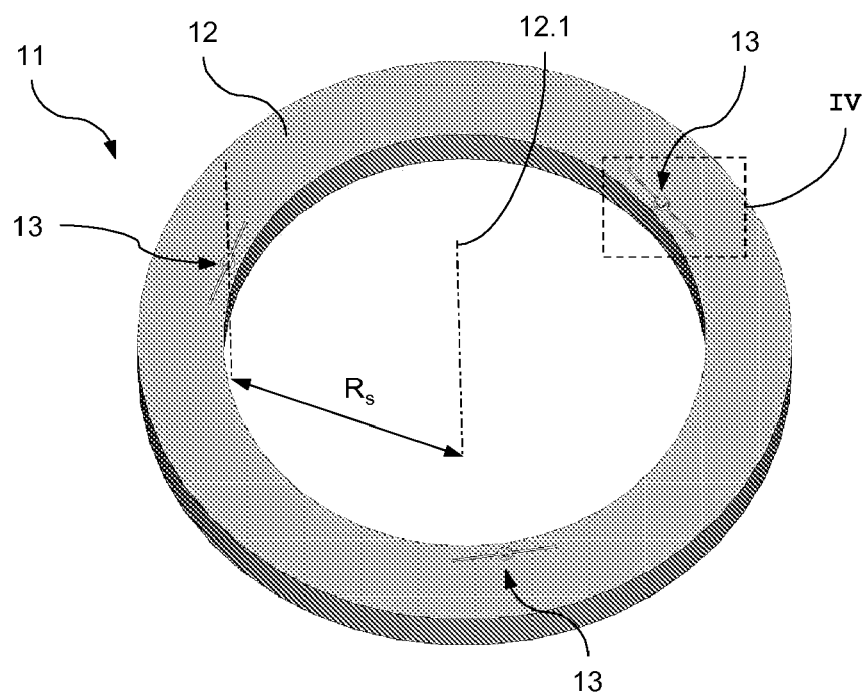
FIG. 3 is a schematic perspective view of the optical element holder of the optical element unit of FIG. 1.
Figure 4:
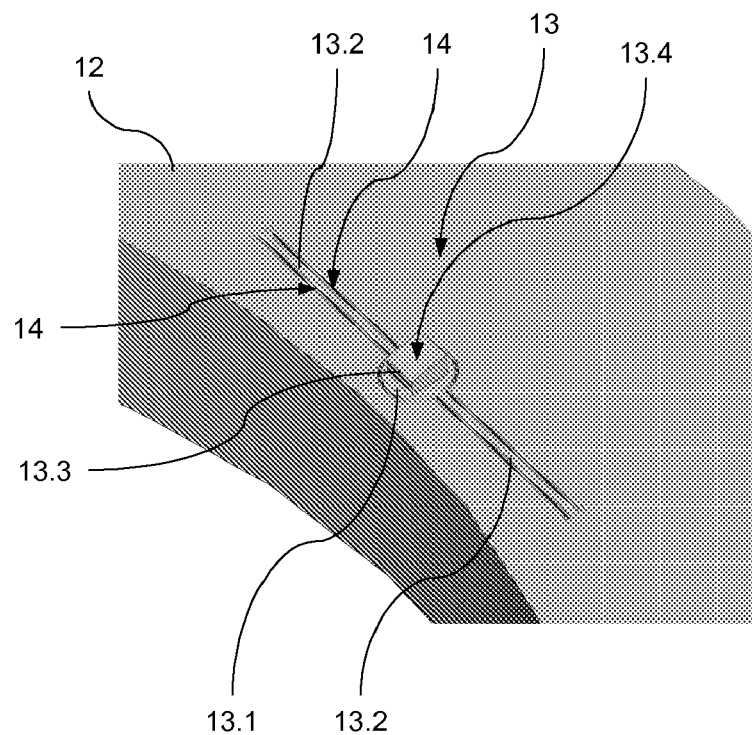
FIG. 4 is a schematic perspective view of the detail IV of FIG. 3.

As can be seen from FIGS. 2 to 4, the optical element module 9 includes an optical element unit 10 with an optical element 8 and an optical element holder 11 holding the lens 8.

The optical element 8 is a rotationally symmetric lens 8 having a first axis of symmetry 8.1 essentially coinciding with the optical axis 3.2 of the optical exposure unit 3. The lens 8 mainly extends in a first plane perpendicular to the first axis of symmetry 8.1.

The optical element holder 11 includes a ring shaped holding element body 12 having a second axis of symmetry 12.1, which—in the situation shown in FIG. 2—essentially coincides with the first axis of symmetry 8.1 of the lens 8. The holding element body 12 extends in a circumferential direction in a second plane perpendicular to the second axis of symmetry 12.1. The holding element body 12 is located immediately adjacent to the lens 8.

The optical element holder 11 further includes three first coupling elements 13 integrally formed within the holding element body 12 and, thus, monolithically attached to the holding element 12. Each first coupling element 13 is formed via two recesses in the form of elongated slots 14 within the holding element body 12. This monolithical design has the advantage that no sumptuous interfaces and connectors have to be provided for the connection between the holding element body 12 and the first coupling elements 13.

The slots 14 completely reach through the holding element body 12 in the direction of its second axis of symmetry 12.1. While mostly extending essentially straight in the second plane, the slots 14 have an arcuate, essentially semicircular cross-section in the second plane in their central region. Thus, a first coupling element 13 is formed that includes a cylindrical central contact element 13.1 and two linking elements in the form of leaf springs 13.2. Anyway, it will be appreciated that the contact element, in particular, may be of any other suitable shape.

It will be appreciated that, with other embodiments of the disclosure, the slots may have a different, e.g. more elaborate and complicated, course to provide an adaptation to a desired deformation behavior of the first coupling elements.

The central contact element 13.1, at its upper side, includes a contact nose 13.3. The contact nose 13.3 protrudes from the holding element body 12 in the direction of its second axis of symmetry 12.1. It forms a contact surface 13.4 for contacting the optical element 8. The contact surface 13.4 is inclined with respect to the first plane. The contact surface 13.4 itself may not be planar. For example, it may be shaped in the manner of a roof providing a substantially central ridging serving as a line contact area for the optical element 8. Thus, good and adjustable contact conditions between the optical element 8 and the optical element holder 11 are achieved.

The leaf springs 13.2 link the contact element 13.1 to the holding element body 12. Thus, while being highly rigid in the direction of the second axis of symmetry 12.1, the first coupling element 13 is radially resilient parallel to the second plane. The leaf springs 13.2 form flexures and may thus, for example, compensate for different thermally induced expansions of the lens 8 and the holding element body 12 as well as for other local relative movements between the lens 8 and the holding element body 12 resulting e.g. from the local introduction of mechanical stresses. Thus, the first coupling element 13 provides for a deformation decoupling between the lens 8 and the holding element body 12.

The three first coupling elements 13 are equiangularly distributed along the circumferential direction of the holding element body 12 at a support radius $R_s$. They provide a three point support to the lens 8 at this support radius $R_s$ such that the lens 8 is supported in a substantially statically defined manner.

The holding element body 12 and, thus, the first coupling elements 13 are made of a ceramic material. In the embodiment, this ceramic material is a silicon infiltrated silicon carbide (SiSiC) ceramic, also known as reaction bonded silicon carbide, having a Young's modulus of 395 GPa and a density of 3 t/m³. Thus, the ratio of its Young's modulus to its density is as high as $$132 \frac{\text{GPa}}{\text{t/m}^3}.$$

This leads to a very rigid and lightweight optical element holder 11 having favorably high resonant frequencies.

Figure 5:
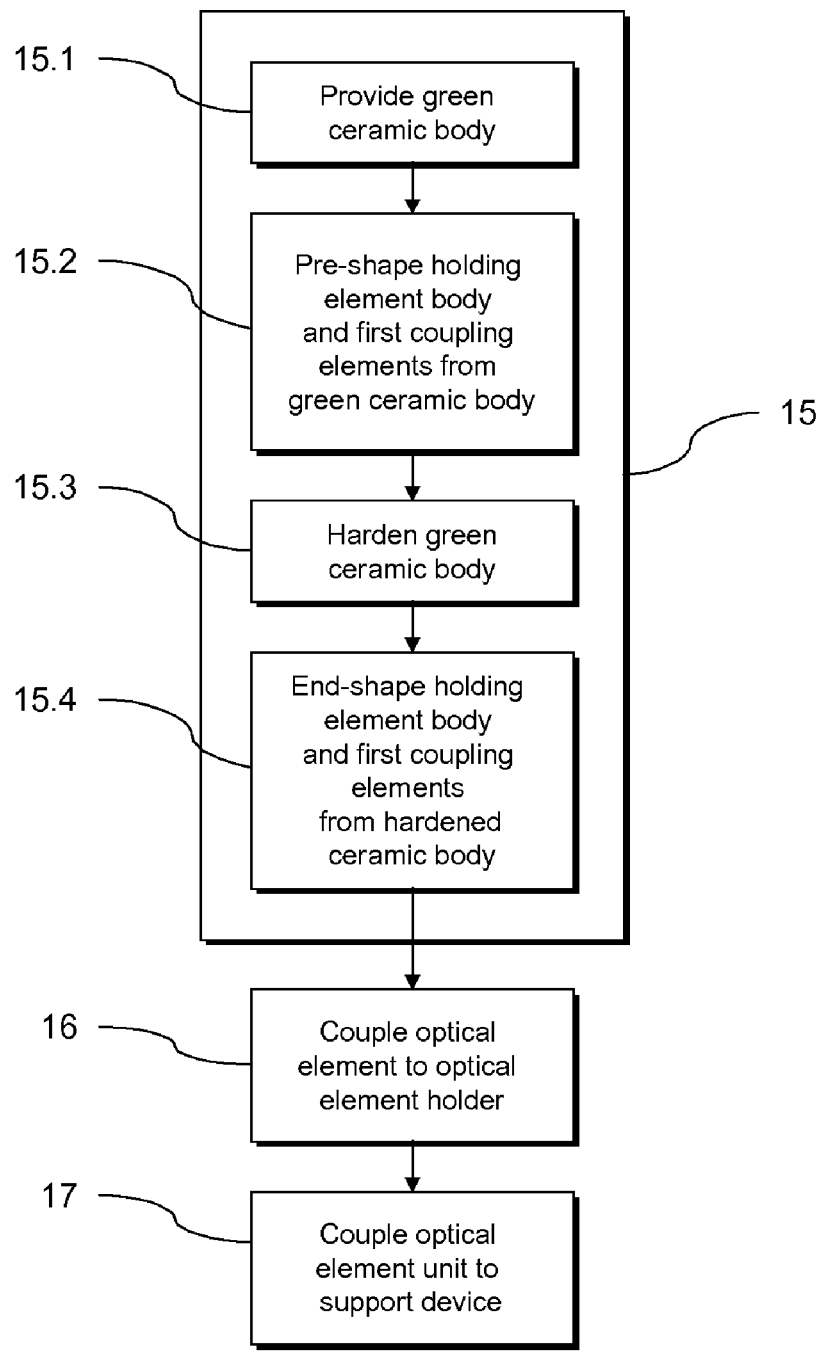
FIG. 5 is a block diagram of a method of manufacturing an optical element unit including a method of manufacturing an optical element holder according to the disclosure.

FIG. 5 is a block diagram of an embodiment of a method of manufacturing the optical element unit 10 including an embodiment of a method of manufacturing the optical element holder 11 according to the disclosure;

As can be seen from FIG. 5, in a first step 15, the optical element holder 11 is formed. This is done in a process wherein, in a first partial step 15.1, a green ceramic body is provided. Then, in a second partial step 15.2, a pre-shaped holding element body 12 with a pre-shaped contact nose 13.3 is machined from a green ceramic body. Anyway, it will be appreciated that, with other embodiments of the disclosure, the green ceramic body itself may already be provided having a pre-shaped holding element body with a pre-shaped contact nose.

Then, in a third partial step 15.3, the pre-shaped green ceramic body is hardened. It is to be noted here that the term "hardened" in the sense of the disclosure is to be understood as a process giving the respective material an increased structural stability, e.g. its final structural stability. Depending on the material used, the hardening process may for example be a sintering process for sintered ceramics. For infiltrated or reaction bonded materials, such as the SiSiC of the embodiment, the hardening process may be an infiltration or reaction bonding process.

In a fourth partial step 15.4, after hardening the green ceramic body, the slots 14 are introduced into the holding element body 12 by an erosion process such as an EDM (electrical discharge machining) process, e.g. wire EDM. Finally, also in the fourth partial step 15.4, the contact nose 13.3 is given its final shape by an erosion process, e.g. wire EDM, as well. In particular, the contact surface 13.4 is formed by such an erosion process. It will be appreciated that, in such a process, the shape of the contact surface 13.4 may easily be formed exactly to the requirements of the respective lens 8.

It is to be noted here that infiltrated or reaction bonded materials such as the SiSiC of the embodiment, due to their electrical conductivity, are particularly suitable for such EDM processes. Anyway, it will be appreciated that other normally less or non conductive materials, e.g. some sinter ceramics, such as SiN, may be provided with a sufficient conductivity by introducing appropriate additives etc.

Furthermore, it will be appreciated that, with other embodiments of the disclosure, any other suitable process or processes may be used for manufacturing the pre-shape of the green ceramic body as well as the final shape of the hardened ceramic body. Such processes may include casting, molding, milling, turning, grinding etc.

Furthermore, it will be appreciated that, with other embodiments of the disclosure, the first coupling elements may be separate parts not manufactured from the holding element body but inserted into a respective recess within the holding element body and connected to the latter by any suitable connecting mechanism. The first coupling elements may be made of the same material or a material which is different from the material of the holding element body. For example, a metal or metal alloy, such as steel etc., may be used for the first coupling elements.

In a second step 16, the optical element unit 10 is completed by coupling the optical element 8 to the optical element holder 11. In the embodiment shown, the first coupling elements 13 directly contact the lens 8. Anyway, it will be appreciated, that with other embodiments of the disclosure, a thin contact layer, e.g. an adhesive or the like, may be placed between the coupling elements and the lens surface. Furthermore, spacers or the like may be placed between the optical element and the contact surfaces of the first coupling elements.

Finally, as can be seen from FIGS. 2 and 5, in a third step 17, the optical element unit 11 is connected to an outer support device in the form of a support ring 18. The connection is provided by three second coupling elements 19 equiangularly distributed along the circumferential direction of the holding element body 12 at its outer circumference. The second coupling elements 19 are active elements providing position adjustment of the optical element unit 11 with respect to the support ring 18.

It will be appreciated that the support ring may be made of any suitable material. In particular, metals and metal alloys such as steel, aluminium etc. may be used.

The second coupling elements 19 may be of any known type providing any type of position adjustment of the optical element unit 11 with respect to the support ring 18. Anyway, it will be appreciated that, with other embodiments of the disclosure, any other type of coupling element may be used for the second coupling elements. In particular passively adjustable coupling elements may be used as well as non adjustable coupling elements.

Furthermore, it will be appreciated that, according to the disclosure, the second coupling elements may be designed and manufactured in a similar manner to the first coupling elements 13 or any other first coupling elements described further below. Thus, for example, the second coupling elements may be elastic and formed monolithically with at least one of the holding element body 12 and the support ring 18. For example, the second coupling elements may be formed monolithically with the holding element body 12 or the support ring 18. They may even be formed monolithically with the holding element body 12 and the support ring 18, e.g. all manufactured from a ceramic body in the process described above.

In a manner similar to the first coupling elements 13, the second coupling elements may provide deformation decoupling between the holding element body 12 and the support ring 18. Thus, it will be appreciated that the second coupling elements may provide the same advantages as outlined above for the first coupling elements 13.

Furthermore, it will be appreciated that, with other embodiments of the disclosure, even only the second coupling elements may be designed in a manner similar to the first coupling elements 13 or any other first coupling elements described further below while the first coupling elements of these embodiments are missing or designed in a conventional manner.

Figure 6:
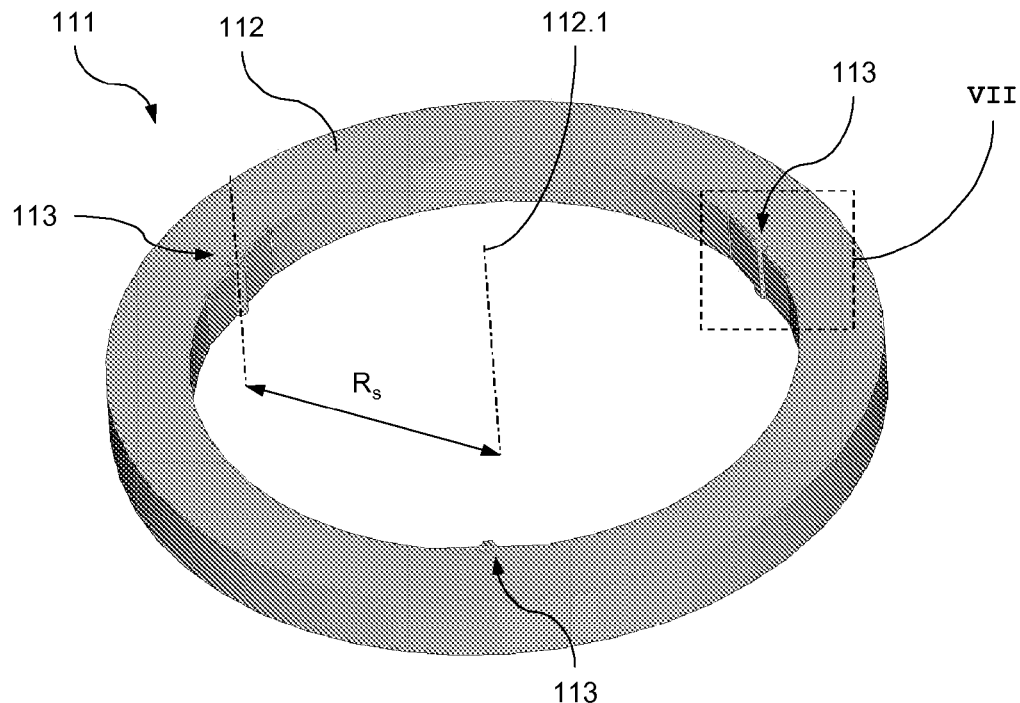
FIG. 6 is a schematic perspective view of an embodiment of an optical element holder according to the disclosure.
Figure 7:
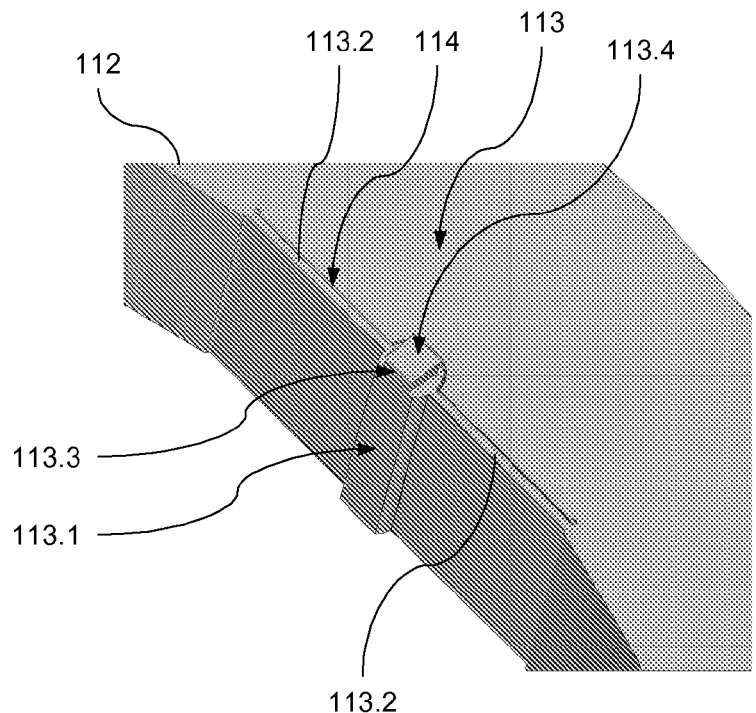
FIG. 7 is a schematic perspective view of the detail VII of FIG. 6.

In the following, an embodiment of an optical element holder 111 according to the disclosure will be described with reference to FIGS. 6 and 7. The optical element holder 111 may replace the optical element holder 11 in the optical element module 9 shown in FIGS. 1 and 2. Thus, an embodiment of the exposure apparatus according to the disclosure may be formed using optical element modules including one or more optical element units including an optical element holder 111.

The optical element holder 111 includes a ring shaped holding element body 112 having a second axis of symmetry 112.1, which usually essentially coincides with the first axis of symmetry of a lens—not shown—which is to be held by the optical element holder 111. The holding element body 112 extends in a circumferential direction in a second plane perpendicular to the second axis of symmetry 112.1. In operation, the holding element body 112 is located immediately adjacent to the lens to be held by the optical element holder 111.

The optical element holder 111 further includes three first coupling elements 113 integrally formed within the holding element body 112 and, thus, monolithically attached to the holding element 112. Each first coupling element 113 is formed via a recess in the form of an elongated slot 114 within the holding element body 112.

The slot 114 completely reaches through the holding element body 112 in the direction of its second axis of symmetry 112.1. While mostly extending essentially straight in the second plane, the slots 114 have an arcuate, essentially semicircular cross-section in the second plane in their central region. Thus, a first coupling element 113 is formed that includes a cylindrical central contact element 113.1 and two linking elements in the form of leaf springs 113.2.

The central contact element 113.1, at its upper side, includes a contact nose 113.3. The contact nose 113.3 protrudes from the holding element body 112 in the direction of its second axis of symmetry 112.1. It forms a contact surface 113.4 for contacting the optical element to be held. The contact surface 113.4 is inclined with respect to the second plane and, thus, inclined to a first plane in which the optical element to be held mainly extends. The contact surface 113.4 has a shape providing a line contact geometry as it has been described above in the context of the first embodiment. Thus, good and adjustable contact conditions between the optical element and the optical element holder 111 are achieved.

The leaf springs 113.2 link the contact element 113.1 to the holding element body 112. Thus, the first coupling element 113 is radially resilient parallel to the second plane. The leaf springs 113.2 form flexures and may compensate for different thermally induced expansions of the lens to be held and the holding element body 112 as well as for other relative movements between the lens to be held and the holding element body 112 resulting e.g. from the local introduction of mechanical stresses. Thus, the first coupling element 113 provides for a deformation decoupling between the lens 8 and the holding element body 112.

The three first coupling elements 113 are equiangularly distributed along the circumferential direction of the holding element body 112 at a support radius $R_s$. They provide a three point support to the lens to be held at this support radius $R_s$ such that the lens is supported in a substantially statically defined manner.

The first coupling elements 113 are located right at the inner circumference of the holding element body 112. Thus, compared to the holding element 11 of FIGS. 2 to 4, at an identical support radius $R_s$, there is provided a larger free inner diameter and, consequently, a larger area for light to pass the respective optical element unit.

The holding element body 112 and, thus, the first coupling elements 113 are made of a ceramic material. In the embodiment, again, this ceramic material is a silicon infiltrated silicon carbide (SiSiC) ceramic having a Young's modulus of 395 GPa and a density of 3 t/m³. Thus, the ratio of its Young's modulus to its density is as high as $$132 \frac{\text{GPa}}{\text{t/m}^3}.$$

This leads to a very rigid and lightweight optical element holder 111 having favorably high resonant frequencies.

The optical element holder 111 is formed in a similar way as the optical element holder 11 of FIGS. 2 to 4. Thus, it is here only referred to the above description.

In the following, an embodiment of an optical element holder 211 according to the disclosure will be described with reference to FIGS. 8 to 11. The optical element holder 211 may replace the optical element holder 11 in the optical element module 9 shown in FIGS. 1 and 2. Thus, an embodiment of the exposure apparatus according to the disclosure may be formed using optical element modules including one or more optical element units including an optical element holder 211.

Figure 8:
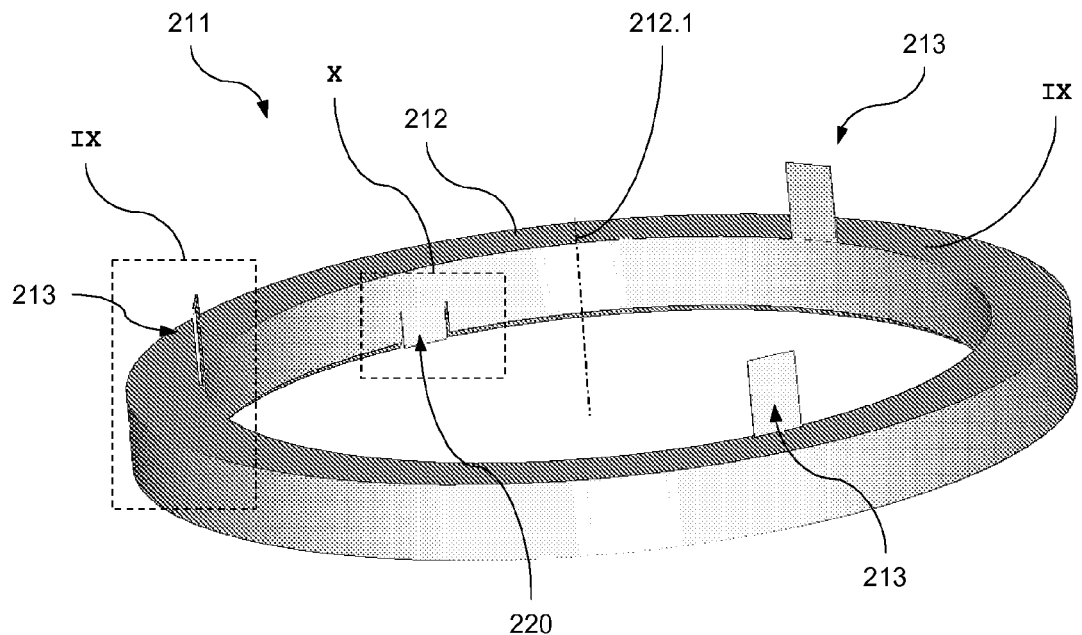
FIG. 8 is a schematic perspective bottom view of an embodiment of an optical element holder according to the disclosure.
Figure 9:
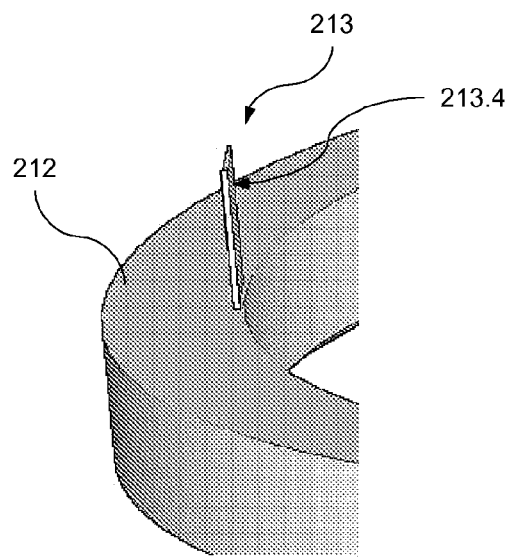
FIG. 9 is a schematic perspective view of the detail IX of FIG. 8.
Figure 10:
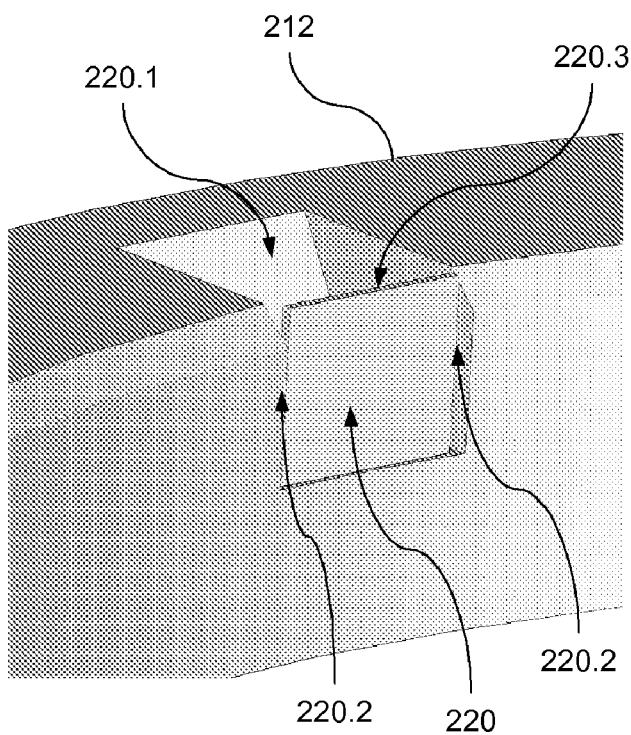
FIG. 10 is a schematic perspective view of the detail X of FIG. 8.
Figure 11:
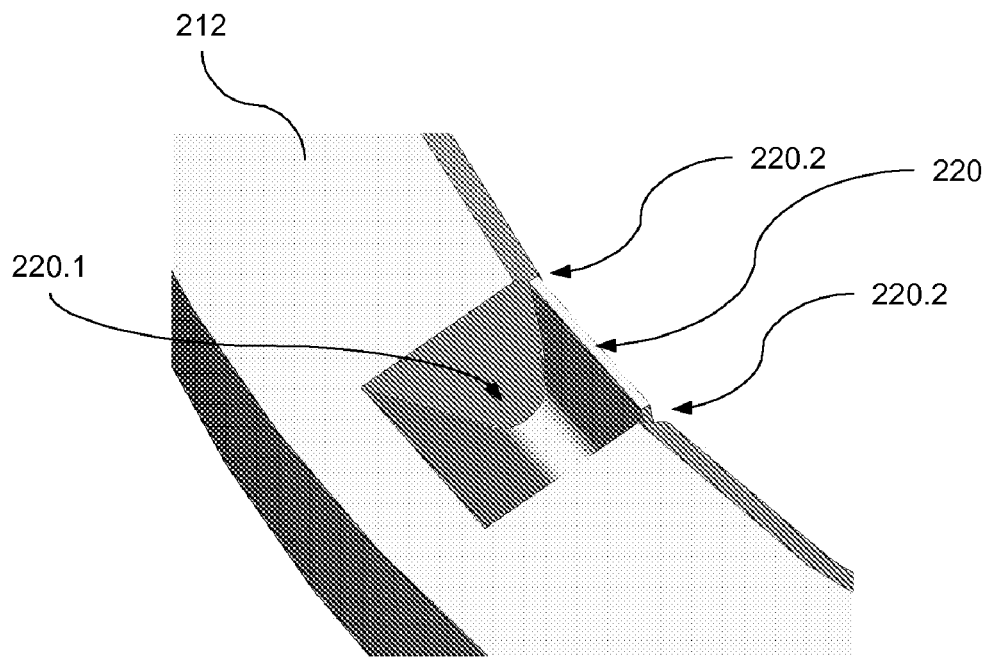
FIG. 11 is another schematic perspective view of the detail X of FIG. 8.

FIGS. 8 and 9 are schematic perspective bottom views to the optical element holder 211, while FIGS. 10 and 11 are schematic perspective top views to the optical element holder 211 from different angles.

The optical element holder 211 includes a ring shaped holding element body 212 having a second axis of symmetry 212.1, which usually essentially coincides with the first axis of symmetry of a lens—not shown—which is to be held by the optical element holder 211. The holding element body 212 extends in a circumferential direction in a second plane perpendicular to the second axis of symmetry 212.1. In operation, the holding element body 212 is located immediately adjacent to the lens to be held by the optical element holder 211.

The optical element holder 211 further includes a first group of three first coupling elements 213 monolithically attached to the holding element 212. Each first coupling element 213 is formed as a leaf spring element protruding in the direction of the second axis of symmetry 212.1. The inner faces 213.4 of the coupling element 213 serve as contacting faces for a first lens—not shown—to be held by the optical element holder 211, e.g. by adhesively coupling the lens to the coupling elements 213.

The optical element holder 211 further includes a second group of three third coupling elements 220 integrally formed within the holding element body 212 and, thus, monolithically attached to the holding element 212. Each third coupling element 220 of the second group is formed via a generally V-shaped recess 220.1 an two slots 220.2 within the holding element body 212. The recess 220.1 and the slots 220.2 are arranged and located close to the inner circumference of the holding element body 212 such that a leaf spring element is formed forming the third coupling element 220. The free end 220.3 of the third coupling element 220 is adapted to contact a second lens—not shown—to be supported by the optical element holder 211.

The three first coupling elements 213 and the three third coupling elements 220 are each equiangularly distributed along the circumferential direction of the holding element body 212. The first coupling elements 213 are shifted with respect to the third coupling elements 220 by an angle of 60° in the circumferential direction. They each provide a three point support to the respective lens to be held such that the lens is supported in a statically defined manner.

The holding element body 212 and, thus, the first coupling elements 213 and the third coupling elements 220 are made of a ceramic material. In the embodiment, this ceramic material is a silicon nitride (SiN) ceramic having a Young's modulus of 300 GPa and a density of 3.2 t/m$^3$. Thus, the ratio of its Young's modulus to its density is as high as $$94 \frac{\text{GPa}}{\text{t/m}^3}.$$

This again leads to a very rigid and lightweight optical element holder 211 having favorably high resonant frequencies.

The optical element holder 211 is formed in a process wherein similar as the one described above with reference to FIG. 5. In a first partial step 15.1, a green ceramic body is provided. Then, in a second partial step 15.2, a pre-shaped holding element body 212 with pre-shaped leaf springs 213 and pre-shaped recesses 220.1 is machined from the green ceramic body. Then, in a third partial step 15.3, the pre-shaped green ceramic body is hardened. In a fourth partial step 15.4, after hardening the green ceramic body, the slots 220.2 are introduced into the holding element body 12 by an erosion process. Finally, also in the fourth partial step 15.4, the leaf springs 213 and other surfaces are given their final shape by an erosion process, e.g. wire EDM, as well. To this end, the SiN has been provided with a suitable electrical conductivity by suitable additives. Anyway, it will be appreciated that, with other embodiments of the disclosure using ordinary SiN, the final shape may be given using a different machining process such as grinding etc.

It will be further appreciated that the holding element body 212 and, thus, the first coupling elements 213 and the third coupling elements 220 may also be made of a beryllium oxide (BeO) ceramic having a Young's modulus of 345 GPa and a density of 2.85 t/m$^3$. Thus, the ratio of its Young's modulus to its density is as high as $$135.1 \frac{\text{GPa}}{\text{t/m}^3}.$$

This again leads to a very rigid and lightweight optical element holder 211 having favorably high resonant frequencies.

Figure 12:
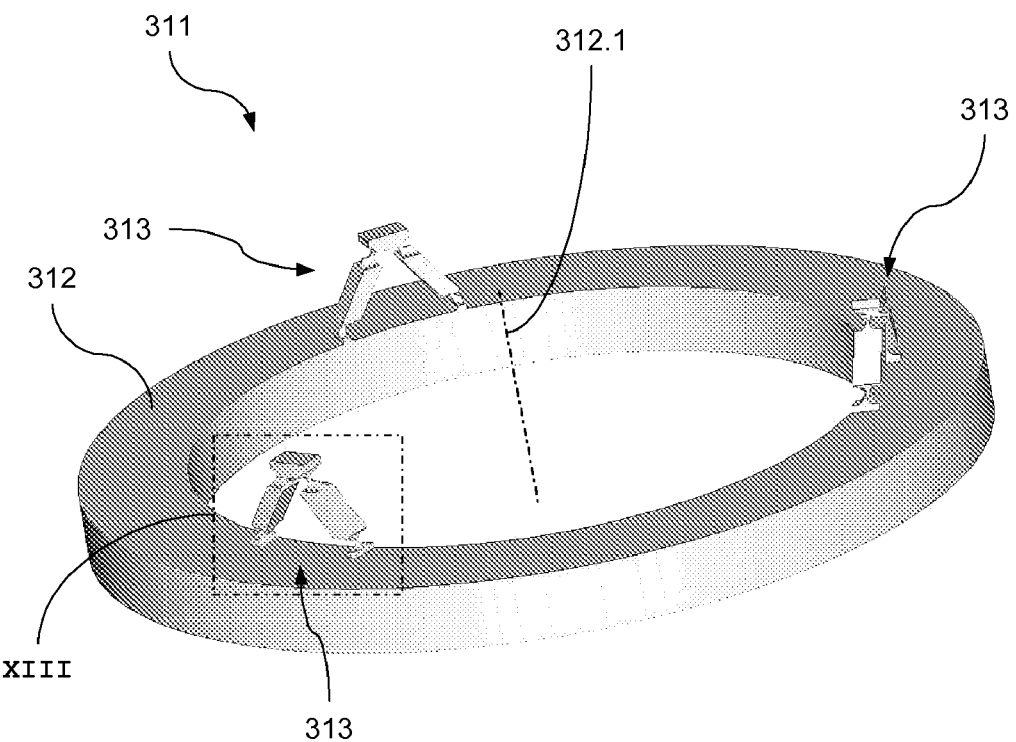
FIG. 12 is a schematic perspective view of an embodiment of an optical element holder according to the disclosure.
Figure 13:
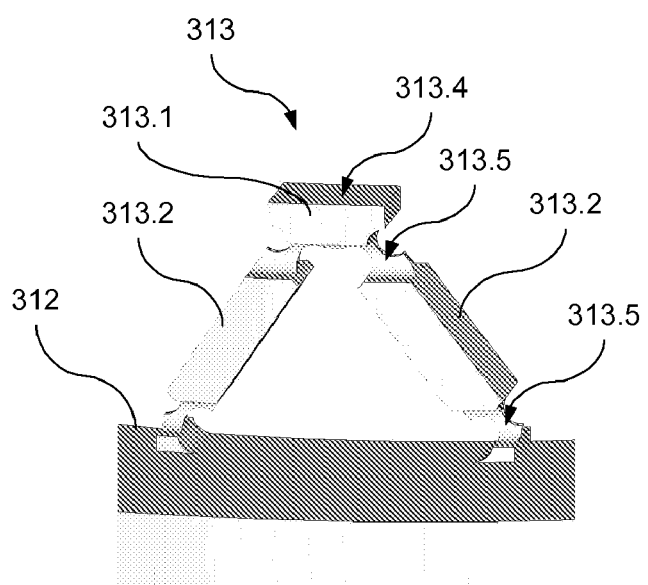
FIG. 13 is a schematic perspective view of the detail XIII of FIG. 12.

In the following, an embodiment of an optical element holder 111 according to the disclosure will be described with reference to FIGS. 12 and 13. The optical element holder 311 may replace the optical element holder 11 in the optical element module 9 shown in FIGS. 1 and 2. Thus, an embodiment of the exposure apparatus according to the disclosure may be formed using optical element modules including one or more optical element units including an optical element holder 311.

The optical element holder 311 includes a ring shaped holding element body 312 having a second axis of symmetry 312.1, which usually essentially coincides with the first axis of symmetry of a lens—not shown—which is to be held by the optical element holder 311. The holding element body 312 extends in a circumferential direction in a second plane perpendicular to the second axis of symmetry 312.1. In operation, the holding element body 312 is located immediately adjacent to the lens to be held by the optical element holder 311.

The optical element holder 311 further includes three first coupling elements 313 monolithically attached to the holding element 312. Each first coupling element 313 is formed by a bipod protruding in the direction of the second axis of symmetry 312.1 of the holding element body 312. The bipod 313 includes a contact element 313.1 and two linking elements in the form of struts 313.2.

The contact element 313.1, at its upper side, forms a contact surface 313.4 for contacting the optical element to be held. The contact surface 313.4 may be inclined with respect to the second plane and, thus, inclined to a first plane in which the optical element to be held mainly extends. Thus, good and adjustable contact conditions between the optical element and the optical element holder 311 are achieved.

The struts 313.2 link the contact element 313.1 to the holding element body 312. Each of the struts 313.2 includes two flexures 313.5. Thus, the first coupling element 313 is radially resilient parallel to the second plane. The flexures 313.5, among others, may compensate for different thermally induced expansions of the lens to be held and the holding element body 312 as well as for other local relative movements between the lens to be held and the holding element body 312 resulting e.g. from the local introduction of mechanical stresses. Thus, the first coupling element 313 provides for a deformation decoupling between the lens to be held and the holding element body 312.

The three first coupling elements 313 are equiangularly distributed along the circumferential direction of the holding element body 312. Together, the three first coupling elements 313 form a hexapod and provide a three point support to the lens to be held such that the lens is supported in a statically defined manner.

The holding element body 312 and, thus, the first coupling elements 313 are made of a ceramic material. In the embodiment, again, this ceramic material is a silicon infiltrated silicon carbide (SiSiC) ceramic having a Young's modulus of 395 GPa and a density of 3 t/m³. Thus, the ratio of its Young's modulus to its density is as high as $$132 \frac{GPa}{t/m^3}.$$

This leads to a very rigid and lightweight optical element holder 311 having favorably high resonant frequencies.

The optical element holder 311 is formed in a process wherein similar as the one described above with reference to FIG. 5. In a first partial step 15.1, a green ceramic body is provided. Then, in a second partial step 15.2, a pre-shaped holding element body 312 with pre-shaped bipods 313 is machined from the green ceramic body. Then, in a third partial step 15.3, the pre-shaped green ceramic body is hardened. In a fourth partial step 15.4, after hardening the green ceramic body, the bipods 313 and other surfaces are given their final shape by an erosion process, such as wire EDM.

Figure 14:
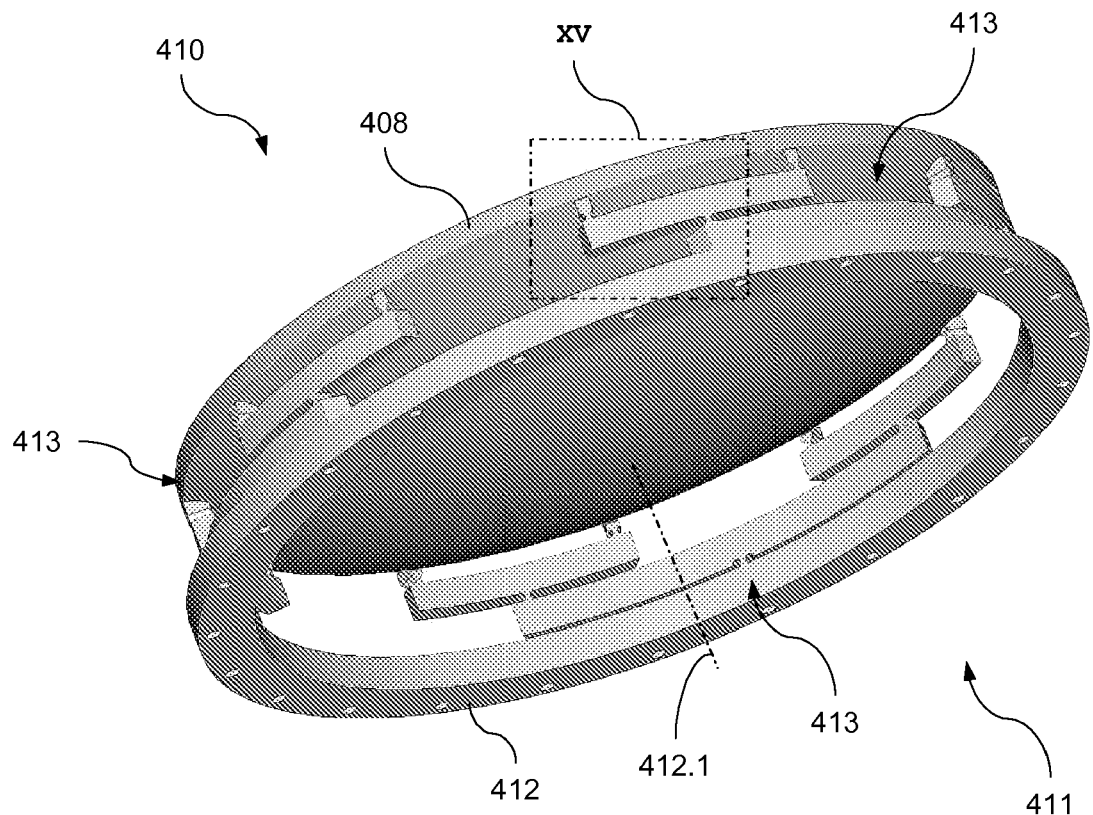
FIG. 14 is a schematic perspective view of an embodiment of an optical element holder according to the disclosure.
Figure 15:
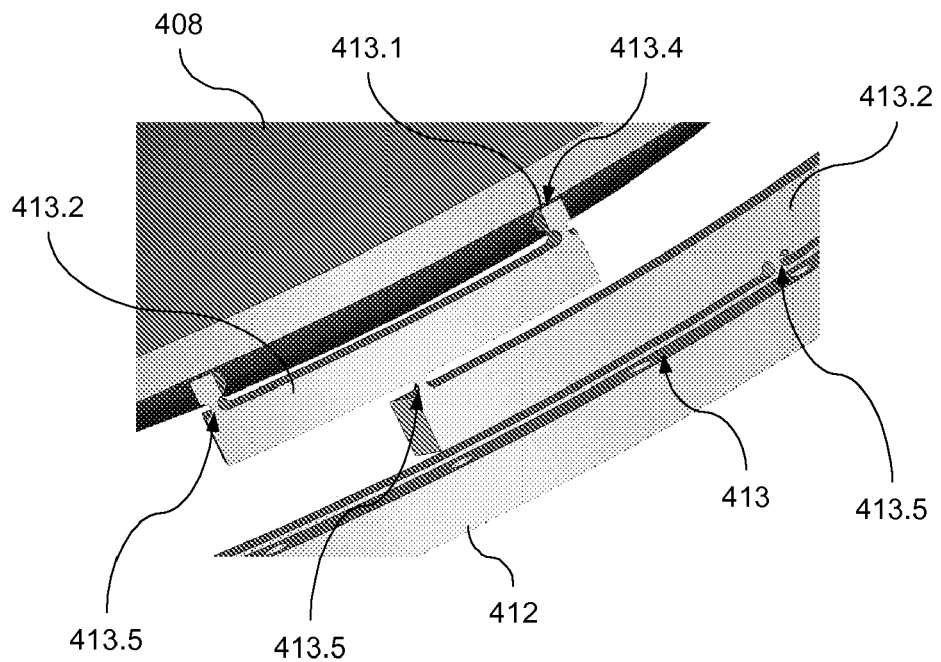
FIG. 15 is a schematic perspective view of the detail XV of FIG. 14.

In the following, an embodiment of an optical element unit 410 with an optical element holder 411 according to the disclosure will be described with reference to FIGS. 14 and 15. The optical element holder 411 may replace the optical element holder 11 in the optical element module 9 shown in FIGS. 1 and 2. Thus, an embodiment of the exposure apparatus according to the disclosure may be formed using optical element modules including one or more optical element units including an optical element holder 411.

The optical element holder 411 includes a ring shaped holding element body 412 having a second axis of symmetry 412.1, which usually essentially coincides with the first axis of symmetry of the lens 408 which is to be held by the optical element holder 411. The holding element body 412 extends in a circumferential direction in a second plane perpendicular to the second axis of symmetry 412.1. In operation, the holding element body 412 is located immediately adjacent to the lens to be held by the optical element holder 411.

The optical element holder 411 further includes three first coupling elements 413 monolithically attached to the holding element 412. Each first coupling element 413 is formed by three beams 413.2 protruding in the direction of the second axis of symmetry 412.1 of the holding element body 412. The first coupling element 413 includes four contact elements 413.1 attached to the two upper beams 413.2.

Each contact element 413.1, at its upper side, forms a contact surface 413.4 for contacting the optical element 408. The contact surface 413.4 is inclined with respect to the second plane and, thus, inclined to a first plane in which the optical element 408 mainly extends. Thus, good and adjustable contact conditions between the optical element and the optical element holder 411 are achieved.

The beams 413.2 link the contact element 413.1 to the holding element body 412. The beams 413.2 are linked by flexures 413.5. Thus, the first coupling element 413 is radially resilient parallel to the second plane. The flexures 413.5, among others, may compensate for different local relative movements between the lens 408 and the holding element body 412 resulting e.g. from thermally induced deformation or the local introduction of mechanical stresses. Thus, the first coupling element 413 provides for a deformation decoupling between the lens to be held and the holding element body 412.

The three first coupling elements 413 are equiangularly distributed along the circumferential direction of the holding element body 412. Together, they form a six point support to the lens 408 such that the lens 408 is supported in a statically defined manner.

The holding element body 412 and, thus, the first coupling elements 413 are made of a ceramic material. In the embodiment, again, this ceramic material is a silicon infiltrated silicon carbide (SiSiC) ceramic having a Young's modulus of 395 GPa and a density of 3 t/m³. Thus, the ratio of its Young's modulus to its density is as high as $$132 \frac{GPa}{t/m^3}.$$

This leads to a very rigid and lightweight optical element holder 411 having favorably high resonant frequencies.

The optical element holder 411 is formed in a process wherein similar as the one described above with reference to FIG. 5. In a first partial step 15.1, a green ceramic body is provided. Then, in a second partial step 15.2, a pre-shaped holding element body 412 with pre-shaped first coupling elements 413 is machined from the green ceramic body. Then, in a third partial step 15.3, the pre-shaped green ceramic body is hardened. In a fourth partial step 15.4, after hardening the green ceramic body, the first coupling elements 413 and other surfaces are given their final shape by an erosion process, such as wire EDM.

Figure 16:
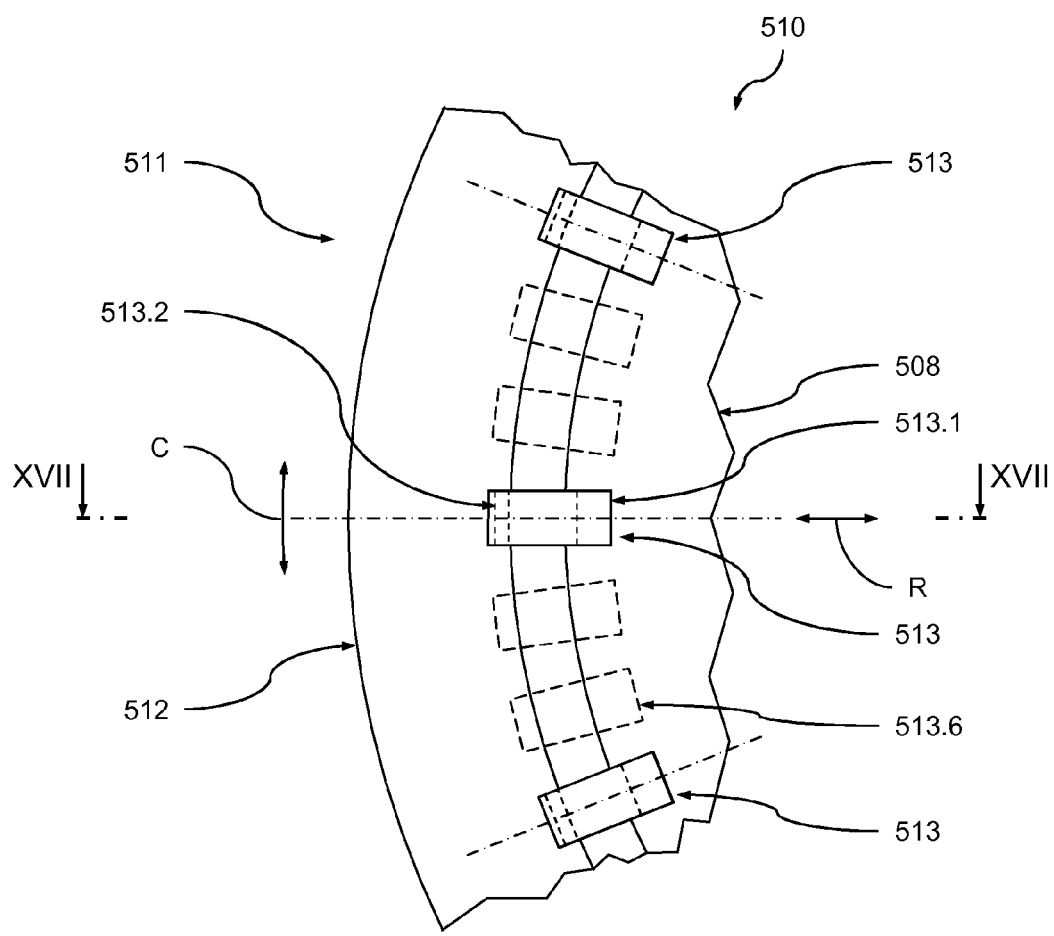
FIG. 16 is a schematic bottom view of a part of an embodiment of an optical element holder according to the disclosure.
Figure 17:
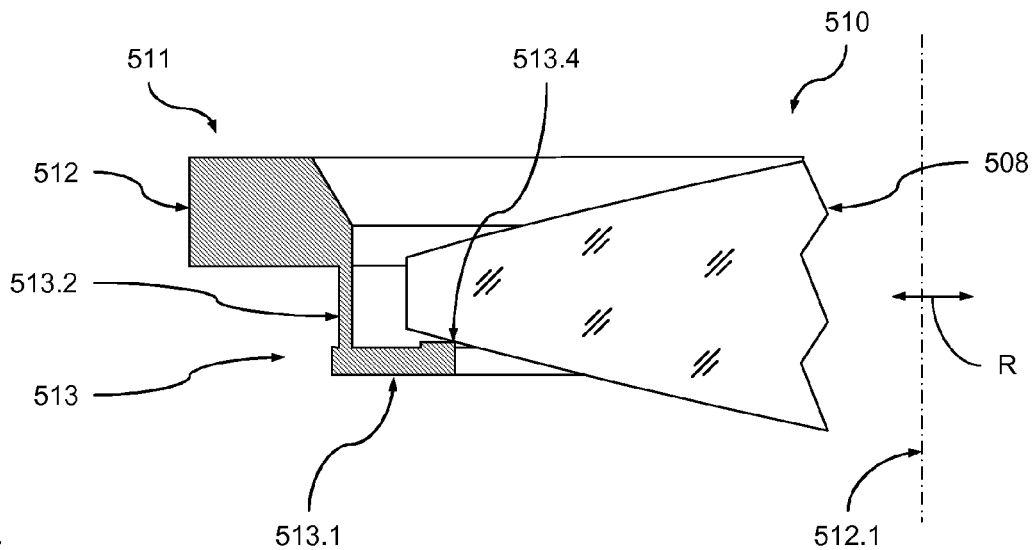
FIG. 17 is a schematic sectional representation of the optical element holder of FIG. 16 along line XVII.

In the following, an embodiment of an optical element unit 510 with an optical element holder 511 according to the disclosure will be described with reference to FIGS. 16 and 17. The optical element holder 511 may replace the optical element holder 11 in the optical element module 9 shown in FIGS. 1 and 2. Thus, an embodiment of the exposure apparatus according to the disclosure may be formed using optical element modules including one or more optical element units including an optical element holder 511.

The optical element holder 511 includes a ring shaped holding element body 512 having a second axis of symmetry 512.1, which usually essentially coincides with the first axis of symmetry of the lens 508 which is to be held by the optical element holder 511. It should be noted that the second axis of symmetry 512.1 is now shown at its correct position in the FIG. 17.

The holding element body 512 extends in a circumferential direction in a second plane perpendicular to the second axis of symmetry 512.1. In operation, the holding element body 512 is located immediately adjacent to the lens 508 to be held by the optical element holder 511.

The optical element holder 511 further a plurality of first coupling elements 513 monolithically attached to the holding element 512. Each first coupling element 513 is formed by a flexure arm 513.2 protruding in the direction of the second axis of symmetry 512.1 of the holding element body 512. Each first coupling element 513 includes a contact element 513.1 attached to the respective flexure arm 513.2.

Each contact element 513.1, at its upper side, forms a contact surface 513.4 for contacting the optical element 508. The contact surface 513.4 forms a contact edge providing good and adjustable contact conditions between the optical element 508 and the optical element holder 511.

The flexure arms 513.2 link the contact element 513.1 to the holding element body 512. Via the flexure arms 513.2 the first coupling element 513 is radially resilient parallel to the second plane (i.e. resilient in the radial direction R). The flexure arms 513.2, among others, may compensate for different local relative movements between the lens 508 and the holding element body 512 resulting e.g. from thermally induced deformation or the local introduction of mechanical stresses. Thus, the first coupling element 513 provides for a deformation decoupling between the lens to be held and the holding element body 512.

The first coupling elements 513 are equiangularly distributed along the circumferential direction C of the holding element body 512. Together, they form a multiple point support to the lens 508. The flexure arms 513.2 have a small rectangular cross-section in the second plane session that they are relatively soft in the radial direction R. Thus, the holding forces introduced into the lens 508 via the first coupling elements 513 are evenly distributed along the outer circumference of the lens 508. It will be appreciated that the number and/or the size of the first coupling elements 513 depends on the required evenness of the distribution of the holding forces to be introduced into the lens 508. Obviously, any suitable number of first coupling elements may be chosen. In particular, a larger number, of first coupling elements may be chosen as it is indicated in FIG. 16 by the dashed contours 513.6.

The holding element body 512 and, thus, the first coupling elements 513 are made of a ceramic material. In the embodiment, again, this ceramic material is a silicon infiltrated silicon carbide (SiSiC) ceramic having a Young's modulus of 395 GPa and a density of 3 t/m³. Thus, the ratio of its Young's modulus to its density is as high as $$132 \frac{\text{GPa}}{\text{t/m}^3}.$$

This leads to a very rigid and lightweight optical element holder 511 having favorably high resonant frequencies.

The optical element holder 511 is formed in a process wherein similar as the one described above with reference to FIG. 5. In a first partial step 15.1, a green ceramic body is provided. Then, in a second partial step 15.2, a pre-shaped holding element body 512 with pre-shaped first but not yet separated coupling elements 513 is machined from the green ceramic body. Then, in a third partial step 15.3, the pre-shaped green ceramic body is hardened. In a fourth partial step 15.4, after hardening the green ceramic body, the first coupling elements 513 and other surfaces are given their final shape by an erosion process, such as wire EDM. In particular, the first coupling elements 513 are separated from each other. Although, in the foregoing, embodiments of the disclosure have been described where lenses are held by the respective optical element holder, it will be appreciated that, with other embodiments of the disclosure, other optical elements, such as mirrors, prisms or diffraction optical elements may be held by the respective optical element holder.

Furthermore, the disclosure has been described in the context of embodiments where the holding element body alone or and the holding element body and the coupling elements are made of a ceramic material. Anyway, it will be appreciated that, with other embodiments of the disclosure, the coupling elements alone may be made of a ceramic material while the holding element body is made of a conventional material, e.g. a metal etc. In this case, the coupling elements are mounted to the holding element body in a suitable way, e.g. via a positive connection, a frictional connection, an adhesive bond as well as arbitrary combinations thereof.

What is claimed is:

1. An optical element unit comprising:
   an optical element; and
   an optical element holder, comprising a holding element and a plurality of coupling elements,
   wherein the holding element holds the optical element, the holding element comprises a ceramic material, the plurality of coupling elements is attached to the holding element, the plurality of coupling elements contacts the optical element, and the plurality of coupling elements provides deformation decoupling between the holding element and the optical element.

2. The optical element unit according to claim 1, wherein the ceramic material comprises at least one material selected from the group consisting of SiN, SiC, SiSiC, C/C-SiC and BeO.

3. The optical element unit according to claim 1, wherein the ceramic material is a reaction bonded ceramic material.

4. The optical element unit according to claim 1, wherein the holding element is located immediately adjacent to the optical element.

5. The optical element unit according to claim 1, wherein at least one of the plurality of coupling elements is formed monolithically with the holding element.

6. The optical element unit according to claim 1, wherein at least one of the plurality of coupling elements is integrally formed within the holding element.

7. The optical element unit according to claim 1, wherein the holding element comprises a holding element body, and at least one of the plurality of coupling elements is formed via at least one recess within the holding element body.

8. The optical element unit according to claim 7, wherein the at least one recess is an elongated slot within the holding element body.

9. The optical element unit according to claim 1, wherein at least one of the plurality of coupling elements comprises a contact element that contacts the optical element and at least one linking element that links the contact element to the holding element.

10. The optical element unit according to claim 1, wherein at least one of the plurality of coupling elements comprises at least one flexure.

11. The optical element unit according to claim 1, wherein at least one of the plurality of coupling elements comprises at least one leaf spring element.

12. The optical element unit according to claim 1, wherein at least one of the plurality of coupling elements forms a bipod.

13. The optical element unit according to claim 1, wherein the optical element mainly extends in a first plane and has a circumference within the first plane, and the coupling elements are distributed essentially equiangularly at the circumference.

14. The optical element unit according to claim 1, wherein the plurality of coupling elements forms a three point support for the optical element or a six point support for the optical element.

15. The optical element unit according to claim 1, wherein the optical element is selected from the group consisting of lenses, mirrors and diffraction optical elements.

16. An optical element module, comprising:
an optical element unit according to claim 1; and
a support device that supports the optical element unit via a second coupling device.

17. The optical element module according to claim 16, wherein the second coupling device is for adjustably positioning the optical element unit with respect to the support device.

18. An optical exposure apparatus, comprising:
an optical projection system, comprising
an optical element unit according to claim 1,
wherein the optical exposure apparatus is configured to transfer an image of a pattern formed on a mask onto a substrate.

19. A method, comprising:
manufacturing a semiconductor device using an optical exposure apparatus according to claim 18.

20. An optical element unit, comprising:
an optical element; and
an optical element holder comprising a holding element and a plurality of coupling elements, the holding element holding the optical element, and the holding element being made of a material having a ratio of its Young's modulus to its density of at least $$35\ \frac{GPa}{t/m^3},$$

wherein the plurality of coupling elements is attached to the holding element, the plurality of coupling elements contacts the optical element, and the plurality of coupling elements provides deformation decoupling between the holding element and the optical element.

21. The optical element unit according to claim 20, wherein the holding element is made of a material having a ratio of its Young's modulus to its density of at least $$45\ \frac{GPa}{t/m^3}.$$

22. The optical element unit according to claim 20, wherein the material of the holding element is a ceramic material.

23. The optical element unit according to claim 22, wherein the ceramic material comprises at least one material selected from the group consisting of SiN, SiC, SiSiC, C/C-SiC and BeO.

24. The optical element unit according to claim 20, wherein the holding element is located immediately adjacent to the optical element.

25. The optical element unit according to claim 20, wherein at least one of the plurality of coupling elements is formed monolithically with the holding element.

26. The optical element unit according to claim 20, wherein at least one of the plurality of coupling elements is integrally formed within the holding element.

27. The optical element unit according to claim 20, wherein the holding element comprises a holding element body, and at least one of the plurality of coupling elements is formed via at least one recess within the holding element body.

28. The optical element unit according to claim 27, wherein the at least one recess is an elongated slot within the holding element body.

29. The optical element unit according to claim 20, wherein at least one of the plurality of coupling elements comprises a contact element that contacts the optical element and at least one linking element that links the contact element to the holding element.

30. The optical element unit according to claim 20, wherein at least one of the plurality of coupling elements comprises at least one flexure.

31. The optical element unit according to claim 20, wherein at least one of the plurality of coupling elements comprises at least one leaf spring element.

32. The optical element unit according to claim 20, wherein at least one of the plurality of coupling elements forms a bipod.

33. The optical element unit according to claim 20, wherein the optical element mainly extends in a first plane and has a circumference within the first plane, and the plurality of coupling elements is distributed essentially equiangularly at the circumference.

34. The optical element unit according to claim 20, wherein the coupling elements form a three point support for the optical element or a six point support for the optical element.

35. The optical element unit according to claim 20, wherein the optical element is selected from the group consisting of lenses, mirrors and diffraction optical elements.

36. An optical element unit, comprising:
an optical element; and
an optical element holder holding the optical element, the optical element holder comprising a holding element and an elastic coupling element attached to the holding element, the elastic coupling element contacting the optical element, and at least one of the elastic coupling element and the holding element being made of a ceramic material, wherein at least one of the following holds:
the ceramic material comprises at least one material selected from the group consisting of SiN, SiC, SiSiC, C/C-SiC and BeO;
the coupling element is formed monolithically with the holding element;
the holding element comprises a holding element body, and the coupling element is formed via at least one recess within the holding element body;
the coupling element comprises at least one leaf spring element;
the coupling element forms a bipod;
the optical element holder comprises a plurality of coupling elements, each of the plurality of coupling elements being attached to the holding element and contacting the optical element.

37. The optical element unit according to claim 36, wherein the ceramic material comprises at least one material selected from the group consisting of SiN, SiC, SiSiC, C/C-SiC and BeO.

38. The optical element unit according to claim 36, wherein the coupling element is formed monolithically with the holding element.

39. The optical element unit according to claim 36, wherein the holding element comprises a holding element body, and the coupling element is formed via at least one recess within the holding element body.

40. The optical element unit according to claim 36, wherein the coupling element provides deformation decoupling between the holding element and the optical element.

41. The optical element unit according to claim 36, wherein the coupling element comprises at least one flexure.

42. The optical element unit according to claim 36, wherein the coupling element comprises at least one leaf spring element.

43. The optical element unit according to claim 36, wherein the coupling element forms a bipod.

44. The optical element unit according to claim 36, wherein the optical element holder comprises a plurality of coupling elements, each of the plurality of coupling elements being attached to the holding element and contacting the optical element.

45. The optical element unit according to claim 44, wherein the optical element mainly extends in a first plane and has a circumference within the first plane, and the plurality of coupling elements is distributed essentially equiangularly at the circumference of the optical element.

46. The optical element unit according to claim 44, wherein the plurality of coupling elements forms a three point support for the optical element or a six point support for the optical element.

47. The optical element unit according to claim 36, wherein the optical element is selected from the group consisting of lenses, mirrors and diffraction optical elements.

48. An optical element holder, comprising:
a holding element; and
an elastic coupling element attached to the holding element, the elastic coupling element contacting the optical element, and at least one of the coupling element and the holding element being made of a material being at least one of a ceramic material and a material having a ratio of its Young's modulus to its density of at least $$35 \frac{\text{GPa}}{\text{t/m}^3}.$$

49. An optical element unit, comprising:
an optical element;
a holding element holding the optical element;
elastic coupling elements; and
a support device supporting the holding element,
wherein:
at least one of the support device and the holding element is made of a ceramic material,
the coupling elements are coupled to the holding element and the support device, and
at least one of the coupling elements is formed monolithically with at least one of the holding element and the support device.

50. The optical element unit according to claim 49, wherein the coupling elements provide deformation decoupling between the holding element and the support device.

51. The optical element unit according to claim 49, wherein the holding element is made of a ceramic material.

52. The optical element unit according to claim 49, wherein the ceramic material comprises at least one material selected from the group consisting of SiN, SiC, SiSiC, C/C-SiC and BeO.

53. The optical element unit according to claim 49, wherein the ceramic material is a reaction bonded ceramic material.

54. The optical element unit according to claim 49, wherein at least one of the support device and the holding element is made of a material having a ratio of its Young's modulus to its density of at least $$35 \frac{\text{GPa}}{\text{t/m}^3}.$$

55. The optical element unit according to claim 49, wherein the holding element is located immediately adjacent to the optical element.

56. The optical element unit according to claim 49, wherein at least one of the coupling elements is integrally formed within the holding element.

57. The optical element unit according to claim 49, wherein the holding element comprises a holding element body, and at least one of the coupling elements is formed via at least one recess within the holding element body.

58. The optical element unit according to claim 57, wherein the at least one recess is an elongated slot within the holding element body.

59. The optical element unit according to claim 49, wherein at least one of the coupling elements comprises a contact element contacting the optical element and at least one linking element that links the contact element to the holding element.

60. The optical element unit according to claim 49, wherein at least one of the coupling elements comprises at least one flexure.

61. The optical element unit according to claim 49, wherein at least one of the coupling elements comprises at least one leaf spring element.

62. The optical element unit according to claim 49, wherein at least one of the coupling elements forms a bipod.

63. The optical element unit according to claim 49, wherein the holding element has an inner circumference and an outer circumference, and the coupling elements are distributed essentially equiangularly at one of the inner circumference and the outer circumference of the holding element.

64. The optical element unit according to claim 49, wherein the coupling elements form a three point support for the optical element or a six point support for the optical element.

65. The optical element unit according to claim 49, wherein the optical element is selected from the group consisting of a lens, a mirror and a diffraction optical element.

66. A method, comprising:
monolithically manufacturing an elastic coupling element and a holding element so that the holding element and the elastic coupling element are attached, wherein the holding element is configured to contact a support device, and the elastic coupling element and the holding element are manufactured from a ceramic material.

67. The method according to claim 66, wherein the ceramic material comprises at least one material selected from the group consisting of SiN, SiC, SiSiC, C/C-SiC and BeO.

68. The method according to claim 66, wherein the method comprises:
providing at least one green ceramic body;
pre-shaping at least one pre-component from the at least one green ceramic body, the pre-component being at least one of the holding element and the elastic coupling element; and
hardening the at least one pre-component.

69. The method according to claim 66, comprising shaping at least one of the holding element and the elastic coupling element from at least one hardened ceramic body.

70. The method according to claim 69, wherein shaping at least one of the holding element and the elastic coupling element comprises eroding the least one hardened ceramic body.

71. The method according to claim 66, comprising at least pre-forming the elastic coupling element by introducing at least one recess into a ceramic body forming the holding element and a pre-component of the elastic coupling element.

72. A method, comprising:

providing a holding element and a plurality of elastic coupling elements attached to the holding element and arranged for contacting one of an optical element and a support device; wherein providing the holding element and the elastic coupling elements comprises manufacturing at least one of the elastic coupling elements and the holding element from a ceramic material.

* * * * *

UNITED STATES PATENT AND TRADEMARK OFFICE
CERTIFICATE OF CORRECTION

PATENT NO. : 7,729,065 B2  Page 1 of 1
APPLICATION NO. : 12/046605
DATED : June 1, 2010
INVENTOR(S) : Armin Schoeppach et al.

It is certified that error appears in the above-identified patent and that said Letters Patent is hereby corrected as shown below:

Column 6, Line 6, delete "disclosure;" insert -- disclosure. --.

Column 9, Line 29, delete "an" insert -- and --.

Column 19, Line 6, in Claim 70, after "the" insert -- at --.

Signed and Sealed this

Twenty-third Day of November, 2010

David J. Kappos
*Director of the United States Patent and Trademark Office*